(12) United States Patent
Renavikar et al.

(10) Patent No.: US 7,205,595 B2
(45) Date of Patent: Apr. 17, 2007

(54) POLYMER MEMORY DEVICE WITH ELECTRON TRAPS

(75) Inventors: Mukul P. Renavikar, Chandler, AZ (US); Gudbjorg H. Oskarsdottir, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 10/816,259

(22) Filed: Mar. 31, 2004

(65) Prior Publication Data

US 2005/0227377 A1    Oct. 13, 2005

(51) Int. Cl.
*H01L 29/76* (2006.01)
*H01L 21/8242* (2006.01)

(52) U.S. Cl. .................. 257/295; 257/296; 257/311; 257/314; 257/E21.208; 438/253; 438/393; 438/E21.209

(58) Field of Classification Search ........ 257/295–311, 257/314; 438/250–252, 257, 393–395
See application file for complete search history.

(56) References Cited

U.S. PATENT DOCUMENTS

| 6,268,620 | B1  |   | 7/2001 | Ouellet et al. |         |
|-----------|-----|---|--------|----------------|---------|
| 6,756,620 | B2  | * | 6/2004 | Li et al.      | 257/295 |
| 6,878,980 | B2  | * | 4/2005 | Gudesen et al. | 257/295 |
| 2002/0030222 | A1 |   | 3/2002 | Agarwal        |         |
| 2003/0179617 | A1 |   | 9/2003 | Gudesen et al. |         |
| 2004/0026729 | A9 | * | 2/2004 | Krieger et al. | 257/306 |
| 2004/0159835 | A1 | * | 8/2004 | Krieger et al. | 257/40  |
| 2004/0209420 | A1 | * | 10/2004 | Ljungcrantz et al. | 438/239 |

FOREIGN PATENT DOCUMENTS

| DE | 198 11 068   | 6/1999 |
|----|--------------|--------|
| EP | 0 468 758    | 1/1992 |
| WO | WO 03/003377 | 1/2003 |

OTHER PUBLICATIONS

Kuo, Y., et al., "Tantalum Nitride Interface Layer Influence on Dielectric Properties of Hafnium Doped Tantalum Oxide High Dielectric Constant Thin Films", Japanese Journal of Applied Physics, vol. 42, No. 7A, Part 2, Jul. 1, 2003, pp. L769-L771.
PCT Search Report and Written Opinion dated Apr. 7, 2006 for International Application No. PCT/US2005/010921, filed Mar. 31, 2005 (12 pages).

* cited by examiner

*Primary Examiner*—Dung A. Le
(74) *Attorney, Agent, or Firm*—Blakely, Sokoloff, Taylor & Zafman LLP

(57) ABSTRACT

An embodiment of the invention reduces damage caused to a polymer ferroelectric layer in a polymer ferroelectric memory device by creating excess holes in the insulating metal nitride and/or metal oxide layers between the metal electrodes and polymer ferroelectric layer. The excess holes in the metal nitride and/or metal oxide trap electrons injected by the metal electrodes under AC bias that would otherwise damage the polymer ferroelectric layer.

22 Claims, 6 Drawing Sheets

POLYMER MEMORY DEVICE WITH ELECTRON TRAPS

FIELD

Embodiments of the invention relate to ferroelectric memory, and more specifically to extending the useful life of a ferroelectric memory device by reducing the ferroelectric material degradation.

BACKGROUND

Memory manufacturers are currently researching and developing the next generation of memory devices. One such development includes technology designed to replace current Flash non-volatile memory technology. Important elements of a Flash successor include compactness, low price, low voltage operation, non-volatility, high density, fast read and write cycles, and long life.

Current Flash technology is predicted to survive into 90 nanometer and 65 nanometer process generations. This survival is in part based on, for example, exotic storage dielectric material, cobalt and nickel source and drain regions, copper and low dielectric constant materials for the interconnect levels, and high dielectric constant materials for transistor gates. However, there will thereafter exist a need for new memory materials and technology, particularly for non-volatile memory.

Ferroelectric memory is one such technology aimed to replace Flash memory. A ferroelectric memory device combines the non-volatility of Flash memory with improved read and write speeds. Simply stated, ferroelectric memory devices rely on the use of ferroelectric materials that can be spontaneously polarized by an applied voltage or electric field and that maintain the polarization after the voltage or field has been removed. As such, a ferroelectric memory device can be programmed with a binary "1" or "0" depending on the orientation of the polarization. The state of the memory device can then be detected during a read cycle.

Two crystalline materials have emerged as promising films utilized in a ferroelectric memory scheme, namely lead zirconium titanate ("PZT") and strontium bismuth tantalite ("SBT"). However, while the materials exhibit appropriate ferromagnetic properties, each is nevertheless expensive to integrate into an existing CMOS process.

More recent developments include the use of polymers that exhibit ferroelectric properties. The creation of polymer ferroelectric memory utilizes polymer chains with net dipole moments. Data is stored by changing the polarization of the polymer chain between metal lines that sandwich the layer comprised of the ferroelectric polymer chain. Further, the layers can be stacked (e.g., metal word line, ferroelectric polymer, metal bit line, ferroelectric polymer, metal word line, etc.) to improve memory element density. The polymer ferroelectric memory devices exhibit microsecond initial read speeds coupled with write speeds comparable to Flash.

DETAILED DESCRIPTION

Figure 1:
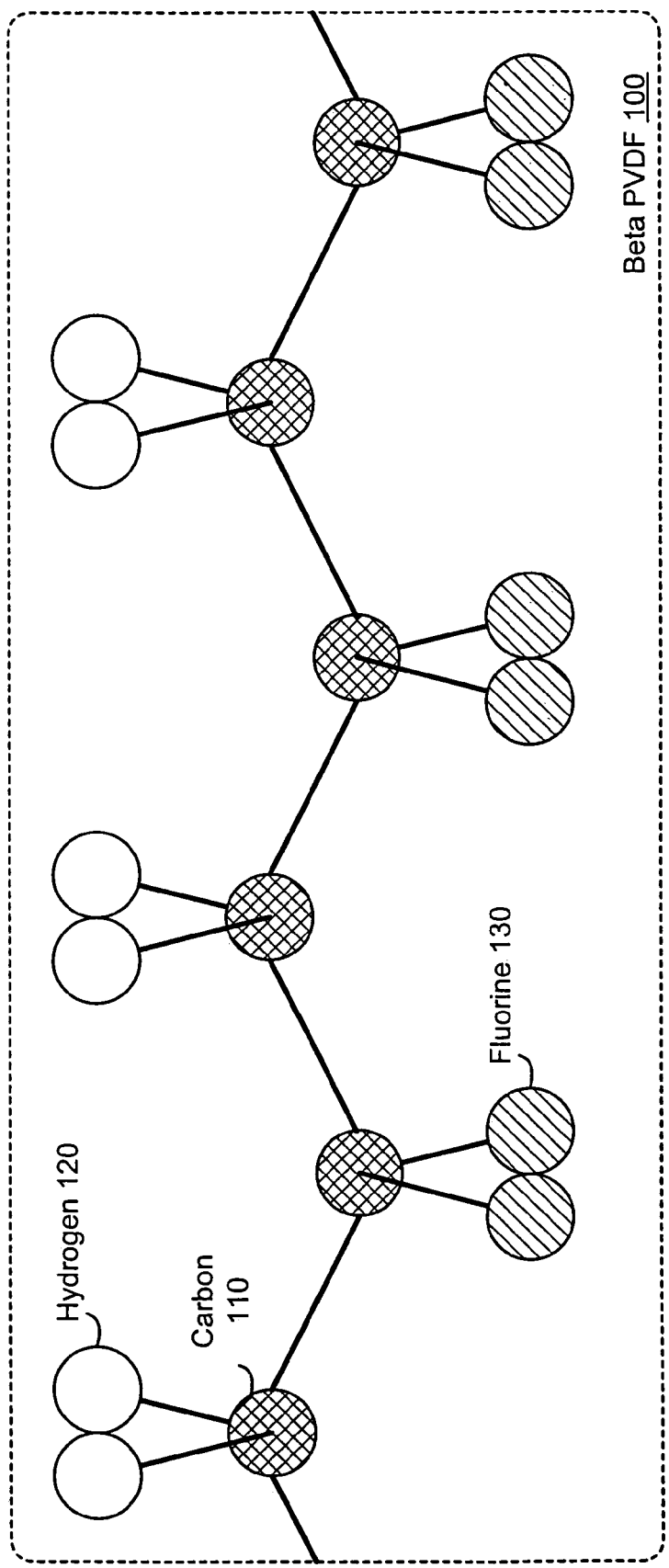
FIG. 1: illustration of a ferroelectric beta phase polyvinylidene fluoride (PVDF) molecule chain.

Embodiments of creating electron traps in metal nitride and metal oxide electrodes in polymer memory devices are described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, an embodiment of the invention reduces damage caused to a polymer ferroelectric layer in a polymer ferroelectric memory device by creating excess holes in the insulating metal nitride and/or metal oxide layers between the metal electrodes and polymer ferroelectric layer. The excess holes in the metal nitride and/or metal oxide trap electrons injected by the metal electrodes under AC bias that would otherwise damage the polymer ferroelectric layer.

As noted, a large portion of the historical research in ferroelectric memory device technology has centered on select crystalline materials such as PZT and SBT. More current trends, however, include utilizing polymer chains that exhibit ferroelectric properties. Polyvinylidene Fluoride ("PVDF") is a fluoropolymer with alternating $CH_2$ and $CF_2$ groups for which the relative electron densities between the hydrogen and fluorine atoms create a net ionic dipole moment. FIG. 1 illustrates the ferroelectric beta phase PVDF 100, including a chain of carbon 110 and alternating and opposing hydrogen 120 and fluorine 130 pairs. A particular PVDF copolymer is polyvinylidene fluoride trifluoroethylene ("PVDF-TrFE"). The addition of the trifluoroethylene $C_2HF_3$ (essentially substituting a hydrogen with a fluorine) in the chain reduces the overall theoretical ionic dipole moment of a ferroelectric PVDF beta phase chain, but increases the likelihood of forming the ferroelectric PVDF beta phase versus the paraelectric PVDF alpha phase during crystallization. The crystalline PVDF-TrFE polymer is ferroelectric in that it can be given a remanent polarization that can be switched in a sufficiently high electric field (i.e., a coercive field). The polarization can be used to store a binary "0" state and a binary "1" state of a memory device fabricated therewith based on the orientation of the polarization.

Memory elements utilizing polymer ferroelectric materials can be passive in the sense that there is no need for active components (e.g., a transistor coupled to a MOS capacitor in DRAM). Data is stored by changing the polarization of the polymer chain between metal lines that sandwich the layer comprised of the ferroelectric polymer. The elements are driven externally by applying a voltage to the appropriate word and bit lines to read or write to a polymer ferroelectric memory cell. Configured as such, the read cycle is destructive and the memory cell must be rewritten akin to a DRAM refresh cycle.

Figure 2:
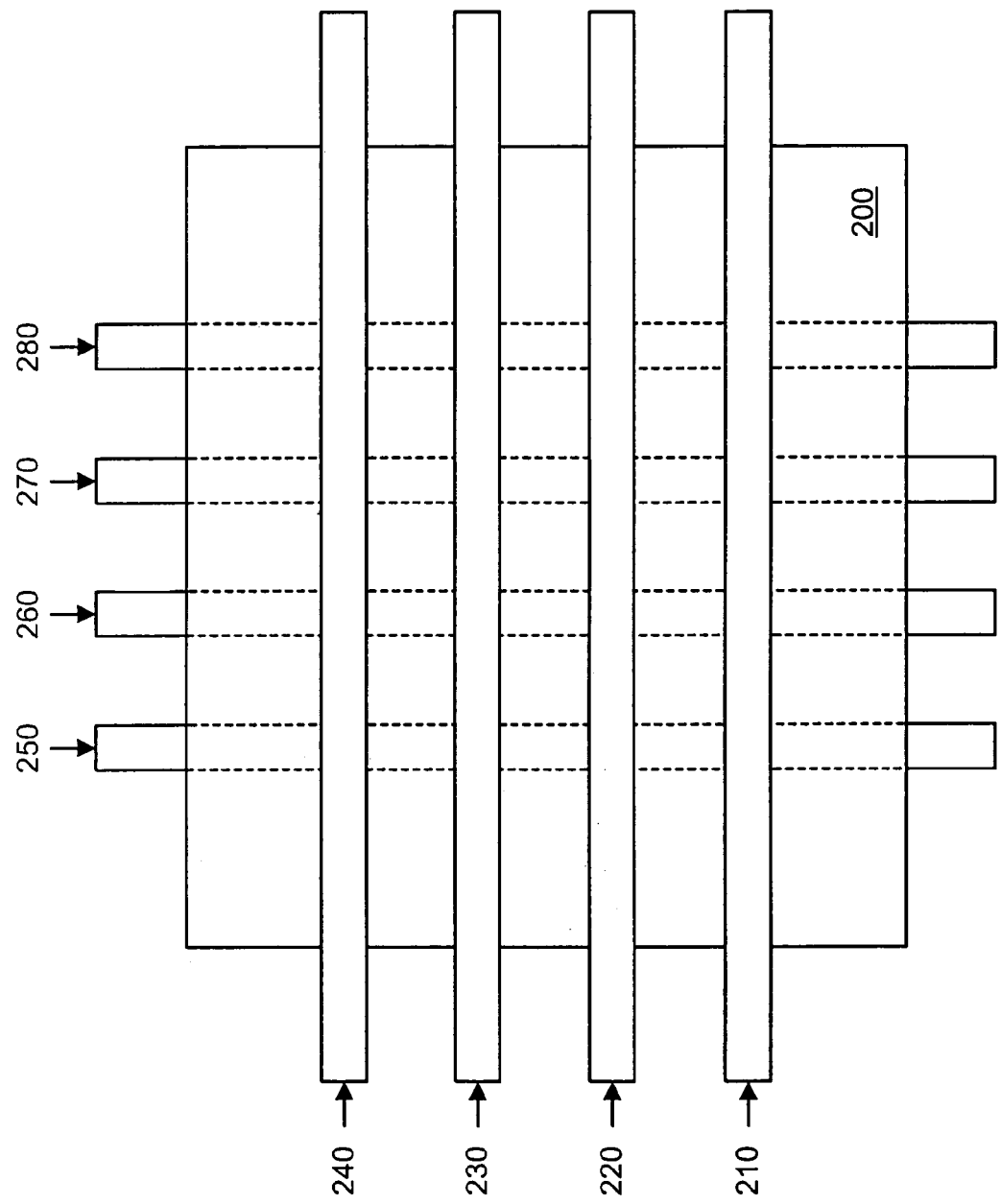
FIG. 2: illustration of a polymer ferroelectric memory device.

FIG. 2 illustrates a top view of a single layer polymer ferromagnetic memory device. Bit lines 250–280 and word lines 210–240 sandwich a layer of polymer ferroelectric material 200. When a voltage is applied across overlapping bit and word lines (e.g., bit line 250 and word line 240) a number of operational processes are possible. A relatively high voltage (e.g., ranging approximately between 8 and 10 volts), can create a coercive electric field sufficient to program a binary "1" state or a binary "0" state based on altering the orientation of the remanent polarization of the polymer ferroelectric material 200 sandwiched between the bit and word lines 250 and 240 respectively. A separate voltage can be applied, in conjunction with external detection circuitry not illustrated, to read the binary state of the memory cell. The sequence of applying alternating voltages to write and/or read the cells of the polymer ferroelectric material subjects the polymer contained within the memory cell to an AC bias. For example, one read or write cycle may expose the cell to a positive voltage difference between the word and bit line while another read or write cycle may expose the cell to a negative voltage difference between the word and bit line.

There are a variety of processing challenges associated with fabricating polymer ferroelectric memory devices. One challenge is to isolate the polymer from the electrodes (e.g., the metal bit and word lines that sandwich the ferroelectric polymer layer). This is generally accomplished with nitride and/or oxide layers between the metal electrodes and the ferroelectric polymer material.

Figure 3:
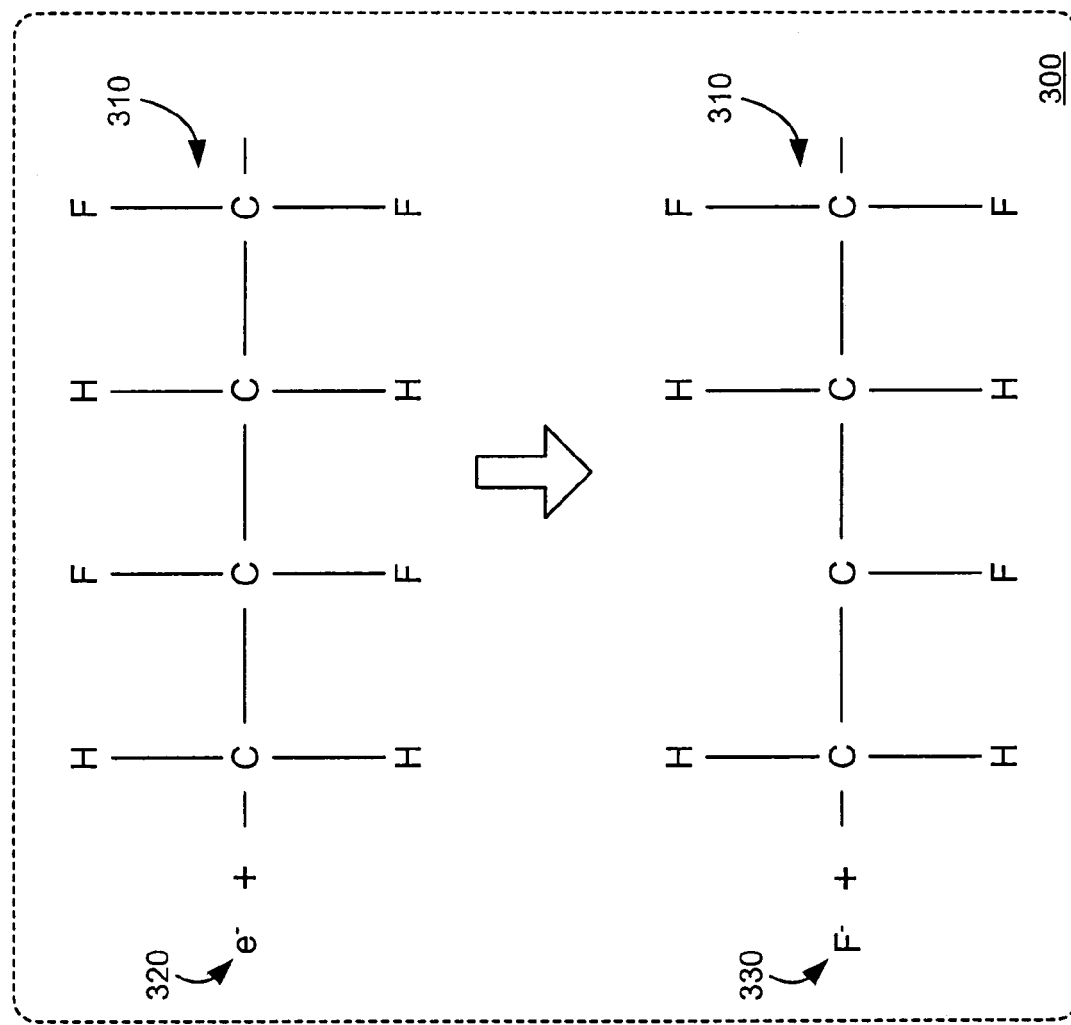
FIG. 3: illustration of an dehydrofluorination reaction.

FIG. 3 illustrates the first step of a dehydrofluorination reaction 300. As the polymer ferroelectric memory device is subjected to an AC bias (e.g., voltage applied to the electrodes to perform a read or write operation) the metal electrode injects electrons into the PVDF 310. An injected electron 320 interacts with a fluorine in the PVDF 310 to create a negatively charged fluorine anion 330. The fluorine anion 330 in turn interacts with a hydrogen in the PVDF 310 to create HF 410 and additional fluoride anion 330 as illustrated by damaged PVDF 420 in FIG. 4. The dehydrofluorination reaction is self-sustaining and severely degrades the ferroelectric performance of the polymer. The HF 410 further attacks the metal electrode material.

Figure 4:
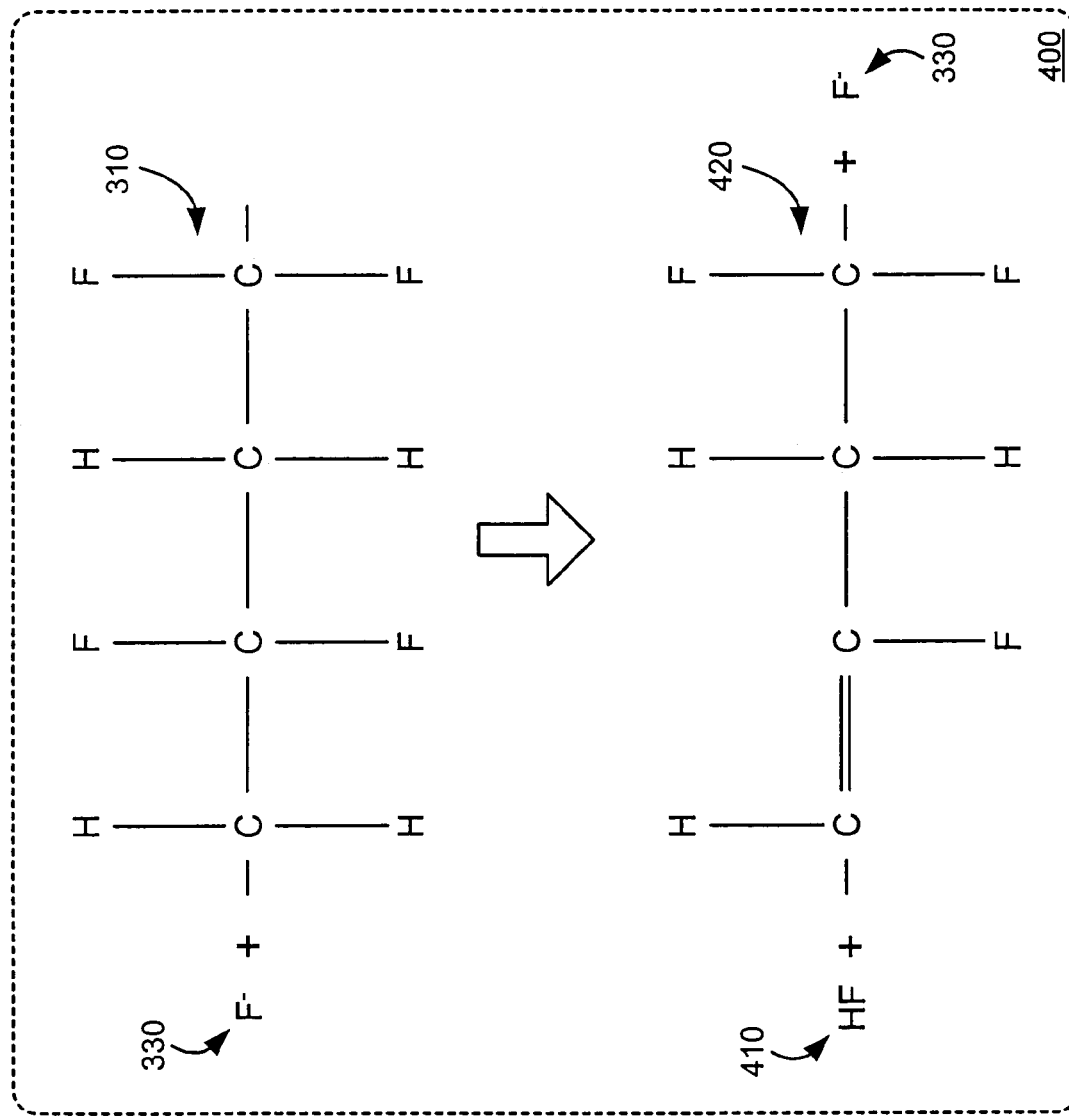
FIG. 4: illustration of a dehydrofluorination reaction.

An embodiment of the invention creates electron traps in the electrode metals to reduce or prevent the electron injection from the metal to the polymer as described with reference to FIGS. 3 and 4. A trap exists when a carrier (in this case an electron) is captured at a center then re-excited without recombination taking place. In this way the traps, often in the form of lattice defects or impurity levels in a semiconductor, remain intact. Alternatively, the electron traps are holes that are generated due to certain point defects introduced in the electrode metals. The electrons can recombine with the holes, preventing their injection into the polymer.

Figure 5:
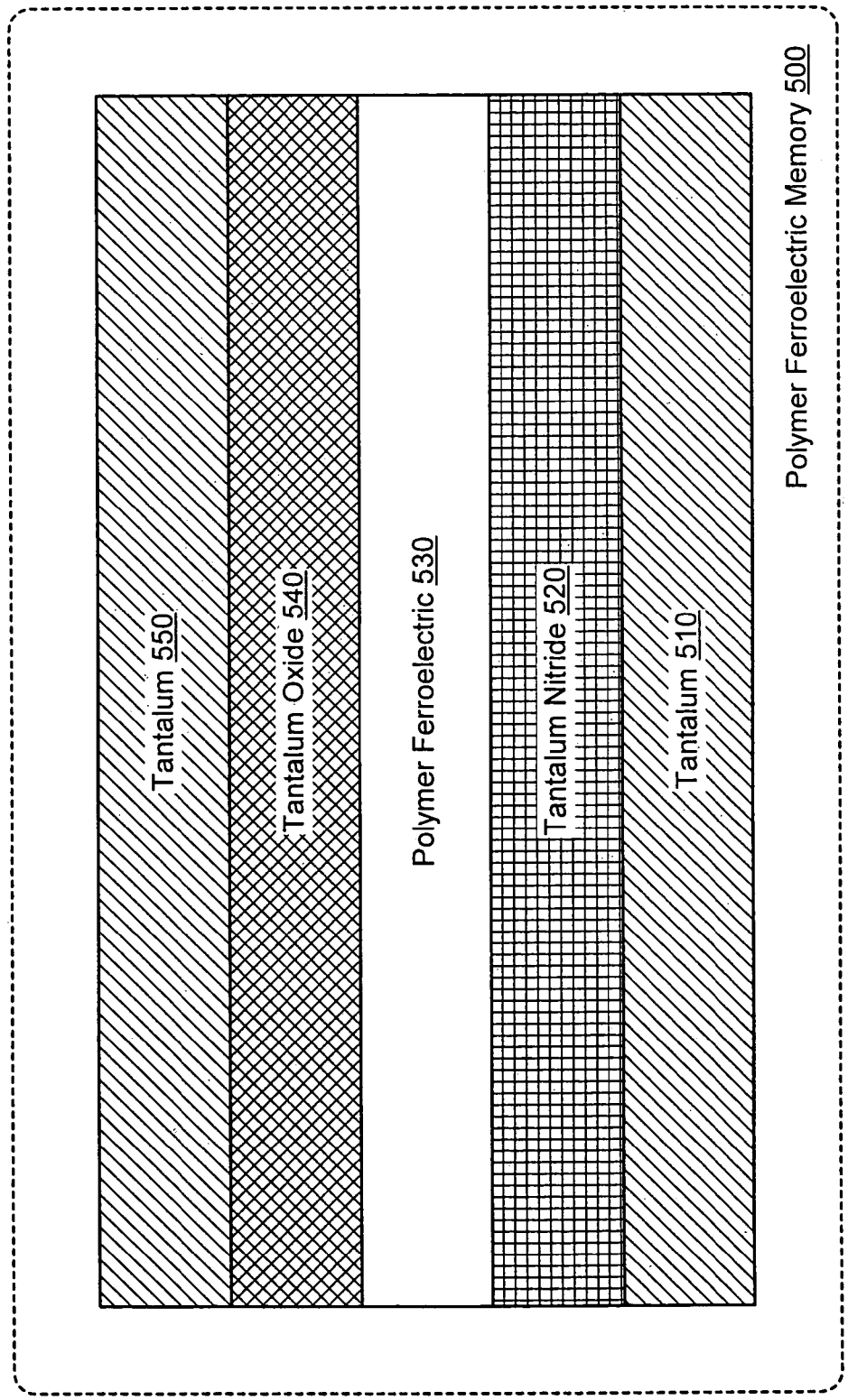
FIG. 5: illustration of a cross section of a polymer ferroelectric memory device according to an embodiment of the invention.

FIG. 5 illustrates a cross section of a polymer ferroelectric memory 500. The substrate onto which the polymer ferroelectric memory is fabricated can be any substrate onto which it would be useful to fabricate a memory device, ranging from, for example, a bulk silicon wafer to the top interconnect, dielectric, or passivation layer of a dual damascene process architecture. In an embodiment, the bottom electrode is tantalum 510. The tantalum is deposited, for example, by physical vapor deposition or sputtering utilizing a tantalum target in an inert argon atmosphere. In an embodiment, the tantalum is sputtered using an Endura sputter tool with a tantalum target that is approximately 99.9995% pure. The base pressure in the deposition chamber is approximately $5.0*10^{-8}$ Torr and the argon pressure is approximately 1.4 mTorr. With 0.0 AC bias watts, uncontrolled temperature, and 1 kW of deposition power/target voltage, the approximately 100 to 150 angstroms thickness of tantalum is deposited in approximately between 10 and 12 seconds.

The second layer in an embodiment is tantalum nitride 520. The tantalum nitride 520 is deposited using physical vapor deposition with a tantalum target in the presence of argon and nitrogen. In an embodiment the ambient is approximately between 80% and 90% nitrogen. Approximate process parameters further include, if different than the tantalum deposition of an embodiment detailed above, 5.9 mT argon pressure and 5 kW deposition power/target voltage. The approximately 50 to 100 angstroms of tantalum nitride is deposited in approximately between 45 and 50 seconds.

In an embodiment, the tantalum nitride 520 is doped with hafnium to create electron traps or excess holes by utilizing a tantalum hafnium alloy physical vapor deposition target that contains up to 3% hafnium. The resulting hole density is approximately between $10^{20}$ and $10^{21}$ holes/cm^3 depending on the weight percentage of hafnium in the tantalum target. It is to be understood that the approximate deposition parameters included for tantalum nitride 520 can be altered or tuned as required by the hafnium content of tantalum hafnium alloy target.

The valence electron structure of the hafnium (atomic number 72, $[Xe]4f^{14}5d^{2}6s^{2}$ electron configuration, versus 73, $[Xe]4f^{14}5d^{3}6s^{2}$ for tantalum) creates holes in the tantalum nitride 520 layer in that the hafnium has one less valence electron in the 5d orbital than the tantalum. The incorporation of hafnium into tantalum lattice sites in tantalum nitride 520 creates an excess of positively charged holes as described by the following expression wherein $Hf_{Ta}$ represents a hafnium substitution for a tantalum in a tantalum lattice site:

When an electron is injected from the tantalum 510 electrode, it recombines with a hole in the tantalum nitride 520. By this mechanism, the point defects created in the tantalum lattice can generate holes which will recombine with the electrons, thereby preventing the electrons from interacting with the ferroelectric polymer material.

Alternatively, instead of doping the tantalum nitride 520 with hafnium, the environment for the tantalum nitride 520 deposition can include an excess of nitrogen to make the deposition tantalum deficient. The partial pressure of nitrogen is increased with respect to the partial pressure of the argon compared to the parameters included above. The partial pressure of the nitrogen, for example, can be increased 33%, 50%, and 100% over the partial pressure used for a tantalum nitride deposition as described above with reference to an embodiment. For such embodiments, the hole densities would be approximately $1.8*10^{21}/cm^3$, $3.6*10^{21}/cm^3$ and $5.4*10^{21}/cm^3$ respectively. The process can be illustrated by the following expression where $V_{Ta}$ is the negatively charged cation vacancy in the tantalum nitride 520 lattice:

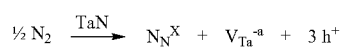

The holes in the tantalum nitride 520 deposited in such a manner serve as electron traps for the electrons injected by the tantalum 510 electrode.

The third layer is a polymer ferroelectric 530. In an embodiment, the polymer ferroelectric 530 is PVDF. In another embodiment, the polymer ferroelectric 530 is a copolymer of PVDF and TrFE. The incorporation of TrFE reduces the theoretical total dipole moment of the PVDF, but increases the likelihood that the resulting polymer crystalline structure will be the ferroelectric beta phase of the PVDF. The polymer ferroelectric 530 is spin-coat deposited after which it is, for example, soft baked at approximately between 120° C. and 150° C. for approximately between 50 and 200 seconds and annealed. In an embodiment, the polymer ferroelectric 530 layer is between 50 and 100 nanometers thick.

The fourth layer in an embodiment is tantalum oxide 540. The deposition of the tantalum oxide 540 utilizes electron beam evaporation instead of physical vapor deposition, as electron beam evaporation is a less abrasive deposition technique and does not, therefore, damage the polymer ferroelectric 530 material onto which the tantalum oxide 540 is deposited. In an embodiment, a CHA electron beam evaporation tool utilizes a tantalum target that is approximately 99.995% pure with 10 kV of electron beam energy and a grounded deposition substrate. The partial pressures of oxygen to argon in the ambient can range from approximately 20:80 to pure oxygen. In an embodiment, the tantalum oxide is approximately between 50 and 100 angstroms.

As explained with reference to the tantalum nitride 520 layer, the tantalum oxide 540 layer of an embodiment is doped with hafnium to create electron vacancies where hafnium occupies a tantalum lattice site. Incorporating the hafnium into the layer of tantalum oxide 540 involves utilizing a tantalum hafnium alloy (up to 3% hafnium) evaporation target material. It is to be understood that the approximate deposition parameters included for tantalum oxide 540 can be altered or tuned as required by the hafnium content of tantalum hafnium alloy target. The evaporation is completed in an atmosphere of argon and oxygen to create the hafnium doped tantalum oxide 540 layer as explained above. The resulting hole density is approximately between 10^20 and 10^21 holes/cm^3 depending on the weight percentage of hafnium in the tantalum target. This can be described by the following expression wherein $Hf_{Ta}$ represents a hafnium substitution for a tantalum in a tantalum lattice site:

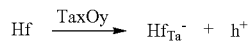

Alternatively, instead of doping the tantalum oxide 540 with hafnium, the ambient for the tantalum oxide deposition 540 can include an excess of oxygen to make the deposition tantalum deficient. The partial pressure of oxygen is increased with respect to the partial pressure of the argon. The partial pressure of the oxygen, for example, can be increased 33%, 50%, and 100% over the partial pressure used for the tantalum oxide deposition as described above. For such embodiments, the hole densities would be approximately 7*10^21/cm^3, 1.4*10^22/cm^3 and 2.1*10^22/cm^3 respectively. The process can be illustrated by the expression:

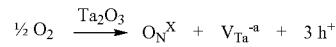

As introduced, $V_{Ta}$ is the negatively charged cation vacancy in the tantalum oxide 540 lattice. The holes in the tantalum oxide 540 deposited in such a manner serve as electron traps for the electrons injected by the tantalum 550 electrode.

The fifth layer is the top electrode. In an embodiment, the top electrode is tantalum 550. The tantalum 550 is deposited, for example, by electron beam evaporation utilizing a 99.995% tantalum target, an inert argon ambient, 10 kV of electron beam energy, and a grounded deposition substrate. The top tantalum 550 electrode is deposited more delicately than the bottom tantalum 510 electrode for the same reasons as mentioned with respect to the tantalum oxide 540 layer. In an embodiment, the top electrode tantalum 550 is approximately between 100 and 150 angstroms thick.

It is to be understood that this stack can be repeated to create multiple levels of polymer ferroelectric memory. In general, the tantalum, tantalum nitride, and tantalum oxide layers that are deposited atop the ferroelectric polymer layer are deposited with electron beam evaporation versus physical vapor deposition as electron beam evaporation is less damaging to the underlying polymer ferroelectric material.

Figure 6:
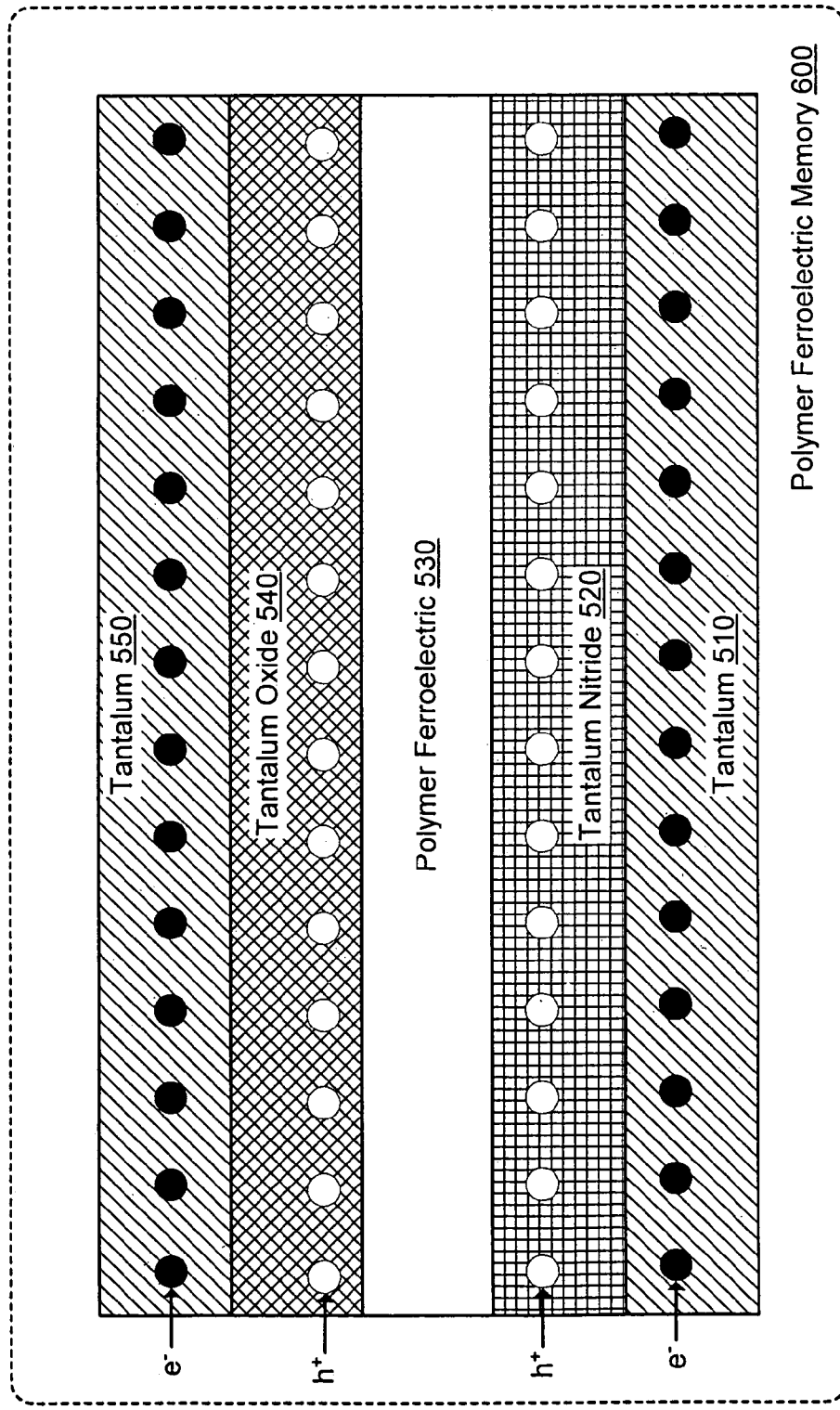
FIG. 6: illustration of a cross section of a polymer ferroelectric memory device according to an embodiment of the invention displaying injected electrons and electron traps.

FIG. 6 illustrates the electron-trapping holes in the tantalum nitride 520 and tantalum oxide 540 layers adjacent to the polymer ferroelectric 530 layer in AC biased polymer ferroelectric memory 600. As illustrated, the electrons injected by the tantalum 510 and 550 electrodes under AC bias will recombine with the holes. As such, the electrons do not trigger the dehydrofluorination mechanism as described above as illustrated by FIGS. 3 and 4.

Hafnium is selected given that it is adjacent to tantalum in the periodic table, and easily substitutes for tantalum in tantalum lattice sites. Further, tantalum hafnium targets are commercially available, as the inclusion of hafnium oxide in tantalum is known in the art as a diffusion barrier against, for example, copper when in contact with the tantalum. It is to be understood, however, that other lanthanide metals could be used instead of hafnium. Further, the electrodes may be molybdenum (useful because it does not react with hydrogen fluoride) for which dopants could include yttrium, zirconium, an niobium.

One skilled in the art will recognize the elegance of the disclosed embodiment in that it mitigates one of the limiting factors of using polymer ferroelectric memory devices by preventing injected electrons from damaging the polymer ferroelectric material.

What is claimed is:
1. An apparatus comprising:
   a first metal electrode layer;
   a metal nitride layer adjacent to the first metal electrode layer wherein the metal nitride layer comprises an excess of holes in the metal nitride layer and wherein the metal nitride layer is one of (a) doped with hafnium or (b) deposited in the presence of excess nitrogen;
   a polymer ferroelectric layer adjacent to the metal nitride layer;
   a metal oxide layer adjacent to the polymer ferroelectric layer; and
   a second metal electrode layer adjacent to the metal oxide layer.

2. The apparatus of claim 1 wherein the first metal electrode layer and second metal electrode layer are tantalum.

3. The apparatus of claim 1 wherein the polymer ferroelectric layer is polyvinylidene fluoride.

4. The apparatus of claim 1 wherein the polymer ferroelectric layer is a polyvinylidene fluoride trifluoroethylene copolymer.

5. The apparatus of claim 1 wherein the metal nitride layer is tantalum nitride.

6. The apparatus of claim 5 wherein the tantalum nitride has a hole density of approximately between $10^{20}/cm^3$ and $10^{21}/cm^3$.

7. The apparatus of claim 5 wherein the tantalum nitride has a hole density of approximately between $1.8*10^{21}/cm^3$ and $5.4*10^{21}/cm^3$.

8. The apparatus of claim 1 wherein the metal oxide layer is tantalum oxide.

9. The apparatus of claim 8 wherein the tantalum oxide layer is doped with hafnium to create excess holes in the tantalum oxide lattice.

10. The apparatus of claim 9 wherein the tantalum oxide has a hole density is approximately between $10^{20}/cm^3$ and $10^{21}/cm^3$.

11. The apparatus of claim 8 wherein the tantalum oxide layer is deposited in the presence of excess oxygen to create excess holes in the tantalum oxide lattice.

12. The apparatus of claim 11 wherein the tantalum oxide has a hole density of approximately between $7*10^{21}/cm^3$ and $2.1*10^{22}/cm^3$.

13. An apparatus comprising:
a metal nitride layer, wherein the metal nitride layer comprises an excess of electron traps in the metal nitride layer and wherein the metal nitride layer is one of (a) doped with hafnium or (b) deposited in the presence of excess nitrogen;
a polymer ferroelectric layer adjacent to the metal nitride layer; and
a metal oxide layer adjacent to the polymer ferroelectric layer.

14. The apparatus of claim 13 wherein the polymer ferroelectric layer is polyvinylidene fluoride.

15. The apparatus of claim 13 wherein the polymer ferroelectric layer is a polyvinylidene fluoride trifluoroethylene copolymer.

16. The apparatus of claim 13 wherein the metal nitride layer is tantalum nitride.

17. The apparatus of claim 13 wherein the metal oxide layer is tantalum oxide.

18. The apparatus of claim 17 wherein the tantalum oxide layer is doped with hafnium to create electron traps in the tantalum oxide lattice.

19. The apparatus of claim 17 wherein the tantalum oxide layer is deposited in the presence of excess oxygen to create electron traps in the tantalum oxide lattice.

20. An apparatus comprising:
a first metal electrode layer;
a metal nitride layer adjacent to the first metal electrode layer wherein the metal nitride layer comprises an excess of holes in the metal nitride layer;
a polymer ferroelectric layer adjacent to the metal nitride layer;
a tantalum oxide layer adjacent to the polymer ferroelectric layer, wherein the tantalum oxide layer is doped with hafnium to create excess holes in the tantalum oxide lattice; and
a second metal electrode layer adjacent to the metal oxide layer.

21. An apparatus comprising:
a first metal electrode layer;
a metal nitride layer adjacent to the first metal electrode layer wherein the metal nitride layer comprises an excess of holes in the metal nitride layer;
a polymer ferroelectric layer adjacent to the metal nitride layer;
a tantalum oxide layer adjacent to the polymer ferroelectric layer, wherein the tantalum oxide layer is doped with hafnium to create excess holes in the tantalum oxide lattice and has a hole density between $10^{20}/cm^3$ and $10^{21}/cm^3$; and
a second metal electrode layer adjacent to the metal oxide layer.

22. An apparatus comprising:
a metal nitride layer, wherein the metal nitride layer comprises an excess of electron traps in the metal nitride layer;
a polymer ferroelectric layer adjacent to the metal nitride layer; and
a tantalum oxide layer adjacent to the polymer ferroelectric layer, wherein the tantalum oxide layer is doped with hafnium to create excess holes in the tantalum oxide lattice.

* * * * *